United States Patent [19]

Van Gorkom et al.

[11] Patent Number: 4,853,754

[45] Date of Patent: Aug. 1, 1989

[54] SEMICONDUCTOR DEVICE HAVING COLD CATHODE

[75] Inventors: Gerardus G. P. Van Gorkom; Henri F. J. Van 'T Blik, both of Eindhoven, Netherlands

[73] Assignee: U.S. Philips Corp., New York, N.Y.

[21] Appl. No.: 21,938

[22] Filed: Mar. 5, 1987

[30] Foreign Application Priority Data

Mar. 17, 1986 [NL] Netherlands ........................ 8600676

[51] Int. Cl.[4] ........................................... H01L 29/161

[52] U.S. Cl. ........................................ 357/16; 357/13; 357/31; 357/58; 357/52

[58] Field of Search ........................ 357/16, 31, 13, 58, 357/52

[56] References Cited

U.S. PATENT DOCUMENTS 3,466,512 9/1969 Seidel .................................... 357/58

*Primary Examiner*—Martin H. Edlow
*Attorney, Agent, or Firm*—Steven R. Biren

[57] ABSTRACT

A semiconductor cathode is realized with the aid of a pin structure in which the intrinsic semiconductor region includes a first region with a small band distance and a second region with a large band distance. Consequently, at a sufficient reverse voltage, electrons (6) are generated in the first region (6) which electrons tunnel from the valence band to the conduction band and have a sufficient potential energy to be emitted from the semiconductor body.

9 Claims, 1 Drawing Sheet

SEMICONDUCTOR DEVICE HAVING COLD CATHODE

BACKGROUND OF THE INVENTION

The invention relates to a semiconductor device for generating an electron current, comprising a cathode having a semiconductor body with an n-type surface region and a p-type region in which electrons leaving the semiconductor body can be generated in said body by giving the n-type surface region a positive bias with respect to the p-type region.

The invention also relates to a pick-up tube and a display device provided with such a semiconductor device.

Semiconductor devices of the type described above are known from Netherlands Patent Application No. 7905470 which corresponds to U.S. Pat. No. 4,370,797.

They are used, inter alia, in cathode ray tubes in which they replace the conventional thermionic cathode in which electron emission is generated by heating. In addition they are used in, for example, apparatus for electron microscopy. In addition to the high energy consumption for the purpose of heating, thermionic cathodes have the drawback that they are not immediately ready for operation because they have to be heated sufficiently before emission occurs. Moreover, the cathode material is lost in the long run due to evaporation, so that these cathodes have a limited lifetime.

In order to avoid the heating source which is troublesome in practice and also to mitigate the other drawbacks, research has been done in the field of cold cathodes.

The cold cathodes known from the aforementioned patent application are based on the emission of electrons from the semiconductor body when a pn-junction is operated in the reverse direction in such a manner that avalanche multiplication occurs. Some electrons may then obtain as much kenetic energy as is required to exceed the electron work function; these electrons are then liberated on the surface and thus supply an electron current.

In this type of cathode the aim is to have maximum possible efficiency, which can be achieved by a minimum possible work function for the electrons. The latter is realized, for example, by providing a layer of material on the surface of the cathode, which decreases the work function. Cesium is preferably used for this purpose because it produces a maximum decrease of the electron work function.

However, the use of cesium may have drawbacks. Inter alia, cesium is very sensitive to the presence (in its ambiance) of oxidizing gases (water vapor, oxygen, $CO_2$). Moreover, cesium is fairly volatile which may be detrimental in those uses in which substrates or compounds are present in the vicinity of the cathode such as may be the case, for example, in electron lithography or electron microscopy. The evaporated cesium may then precipitate on the these objects.

SUMMARY OF THE INVENTION

It is an object of the present invention to provide, inter alia, a semiconductor device of the type described above in which a material decreasing the work function need not always be used so that the above-mentioned problems do not occur.

It is another object of the invention to provide cold cathodes of the type described which have a much higher efficiency if the use of cesium or an other material decreasing the work function involves no problems or negligibly few problems.

A semiconductor device according to the invention is to this end characterized in that a substantially intrinsic semiconductor region is present between the n-type surface region and the p-type region, the band gap of the intrinsic semiconductor material at the area of the transition between the instrinsic semiconductor material and the p-type region being smaller than that at the area of the transition between the intrinsic semiconductor material and the n-type surface region.

By choosing the band gap to be sufficiently small, notably at the transition between the p-type region and the intrinsic material, electrons can tunnel from the valence band to the conduction band with a sufficiently strong electric field. These electrons have a sufficient potential energy to exceed the work function. Since the band gap at the surface is greater, the tunnel effect hardly occurs there (and therefore hardly any electron generation). This is notably achieved in that the intrinsic semiconductor material consists of at least two different semiconductor materials having a different band gap.

Substantially intrinsic is to be understood to mean a region having a light p-type or n-type doping with an impurity concentration of not more than $5\times10^6$ atoms/cubic cm.

The invention will now be described in greater detail with reference to several embodiments and the drawing in which:

DESCRIPTION OF THE PREFERRED EMBODIMENTS

Figure 1:
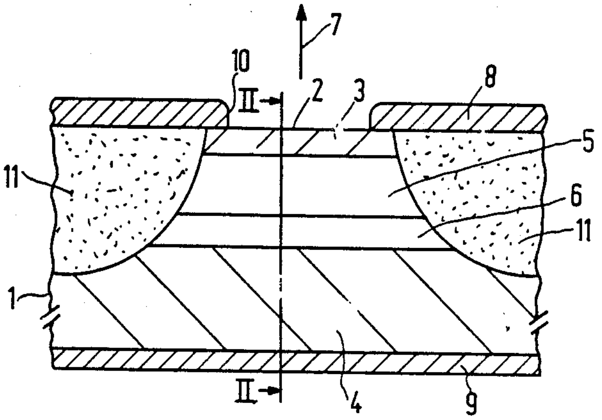
FIG. 1 is a diagrammatical cross-section of a semiconductor device according to the invention.

FIG. 1 shows in a cross-section a semiconductor device according to the invention adapted to generate an electron beam. To this end this device comprises a cathode having a semiconductor body 1. In this embodiment the semiconductor body 1 has at a main surface 2 an $n^+$-type surface region 3 with a thickness of approximately 15 nanometers which is separated from a $p^+$-type substrate 4 by a sustantially intrinsic semiconductor layer. In this embodiment the substantially intrinsic semiconductor layer is divided into sublayers 5 and 6 with thicknesses of approximately 25 nanometers and approximately 5 nanometers, respectively. The $n^+$-type surface region 3, the p-type substrate 4 and the sublayer 6 consist in this embodiment of gallium arsenide (GaAs), while the sublayer 5 consists of a region having a greater band gap such as aluminum gallium arsenide ($Al_xGa_{1-x}As$ with $X=0.4$). In the operating condition electrons are generated, which gives rise to an electron beam 7. For applying electrical voltages to reach this operation condition the device is provided with metal contacts 8 and 9 which contact the $n^+$-type region 3 and $p^+$-substrate 4, respectively. The emission is limited to an aperture 10 in the connection electrode 8 because the region 11 has been rendered electrically inactive.

Figure 2:
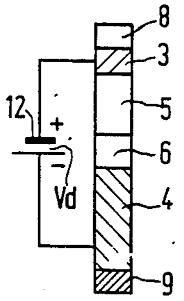
FIG. 2 is a diagrammatical cross-section taken on the line II—II in FIG. 1.
Figure 3:
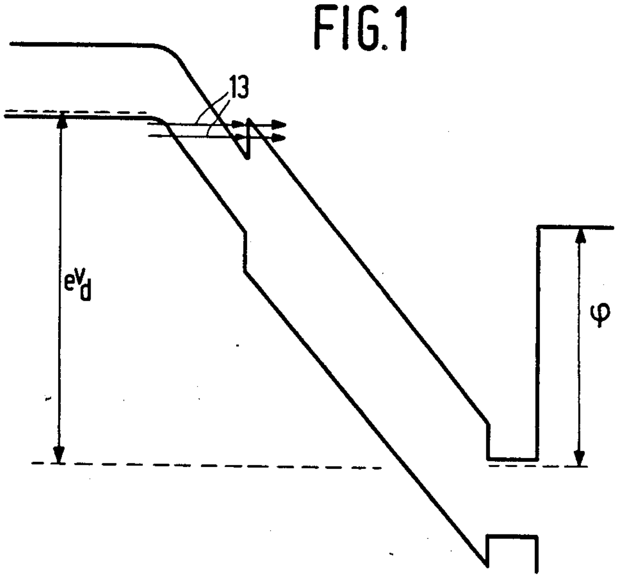
FIG. 3 diagrammatically shows the associated electron energy diagram.

FIG. 2 diagrammatically shows a cross-section taken on the line II—II in FIG. 1, while FIG. 3 shows the associated electron energy diagram if a voltage of the order of $V_d$ is applied across the contacts 8, 9 (see FIG. 1) via a voltage source 12, while the surface region 3 is positively biased with respect to the substrate 4. The voltage $V_d$ is sufficiently high to generate a field strength in the intrinsic part 5, 6 with a sufficiently high value (for example $\geqq 10^6$ V/cm) so that in the GaAs region 6 electrons reach the condition band from the valence band by means of tunnelling (denoted by arrows 13 in FIG. 3). Since the tunnel current density considerably decreases at larger values of the band gap of the semi-conductor material, such a tunnel current will substantially only be produced in the GaAs region 6. Due to the chosen values of the thickness of the regions 5 and 6 and the voltage $V_d$ the potential energy of the electrons in the region 6 is greater than the electron emission energy $\phi$. The energy difference with respect to $\phi$ is such that after a possible energy loss due to interactions with the grid a considerable part of the electrons has sufficient energy to be able to be emitted from the semiconductor body.

Although at the said field strength electron generation may also occur due to avalanche multiplication, it will be small by a suitable choice of material and dimensions. The ionization energy is high in $Al_xGa_{1-x}As$ nevertheless due to the small dimensions an electron, even though a high field is present, can hardly acquire sufficient potential energy to realize extra ionization in the region where the energy of the electrons generated by this ionization is above the electron emission energy $\phi$.

The device of FIG. 1 may be manufactured as follows. A (100)-oriented $p^+$-substrate of gallium arsenide is initially made which is doped with zinc and has an impurity concentration of approximately $2.10^{19}$ atoms/$cm^3$. By means of epitaxial deposition techniques such as MBE or MOVPE the substantially intrinsic layer likewise of gallium arsenide is successively provided thereon with a thickness of approximately 5 nanometers. Similarly, the $Al_xGa_{1-x}As$ layer is provided thereon with a thickness of approximately 25 nanometers. The layers 5 and 6 may be lightly doped ($\pi$- or $\nu$-type) up to a maximum impurity concentration of $10^{16}$ atoms/$cm^3$, but preferably much less.

The $n^+$-type surface region 3 is also provided by epitaxial deposition techniques with a thickness of approximately 15 nanometers and an impurity concentration of approximately $4.10^{19}$ atoms/$cm^3$. By means of ion bombardment the semiconductor material is rendered electrically inactive at the area of the regions 11 as far as the substrate 4, whereafter the assembly is provided with connection contacts 8 and 9. For providing the connection contact 8 the device may alternatively be provided with an insulating layer, for example, an oxide layer with an aperture across which conductors extend for the purpose of connection. In that case the electrically inactive region 13 may be dispensed with, if desired.

Instead of rendering the regions 11 electrically inactive, cavities may be etched at these areas which are then filled up with oxide, if necessary, until a flat surface is obtained across which connection conductors 8 can extend.

To increase the efficiency even more, the device can be provided at the surface 2 within the aperture 10 with a layer of work-function decreasing material such as barium or cesium.

Figure 4:
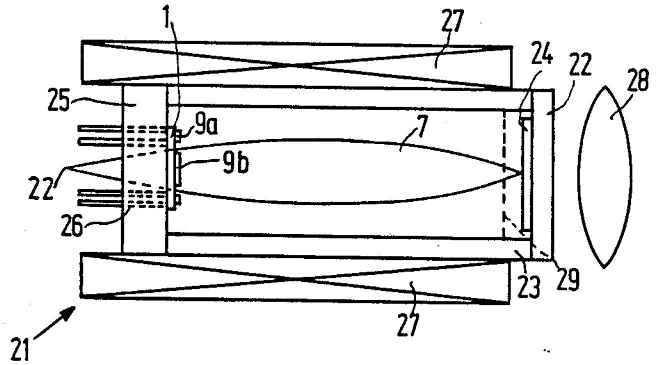
FIG. 4 shows a cathode ray tube provided with a semiconductor device according to the invention.

FIG. 4 diagrammatically shows a pick-up tube 21 provided with a semiconductor cathode 1 according to the invention. The pick-up tube also comprises a photoconducting target plate 24 in a hermetically closed vacuum tube 23, which plate is scanned by the electron beam 7, while the pick-up tube is also provided with a system of coils 27 for deflecting the beams and with a screen grid 29. An image to be picked up is projected onto the target plate 24 with the aid of the lens 28, the end wall 22 being permeable to radiation. For the purpose of electrical connections the end wall 25 is provided with lead-throughs 26. In this embodiment the semiconductor cathode according to FIG. 1 is mounted on the end wall 25 of the pick-up tube 21.

Similarly a display tube can be realized in which, inter alia, a fluorescent screen is present at the area of end wall 22.

The invention is of course not limited to the embodiments stated hereinbefore. A number of structures according to FIG. 1 may be arranged in a matrix in which the $p^+$-substrate 4 is replaced by $p^+$-type zones arranged in rows which constitute row connections and which are then contacted at the surface of the semiconductor body, while column connections are realized via parallel arranged connection pins 8.

The variation of the band gap of the intrinsic semiconductor material may alternatively be obtained by using $Al_xGa_{1-x}As$ where x slowly increases in the direction towards the surface. The use of more than two types of semiconductor material is also possible.

In addition various other materials may be chosen, such as, for example, other combinations of $A_3B_5$ materials.

Instead of these semiconductor materials, materials of the $A_2B_6$ type may alternatively be chosen.

Finally a diversity of variations is possible in the method of manufacture.

What is claimed is:

1. A semiconductor device for generating an electron beam by means of a cathode comprising a semiconductor body having an n-type surface region and an underlying a p-type region, in which electrons leaving the semiconductor body can be generated in said body by giving the n-type region a positive bias with respect to the p-type region, characterized in that a substantially intrinsic semiconductor region is present between the n-type surface region and the underlying p-type region, the band gap of the intrinsic semiconductor material at the area of the transition between the intrinsic semiconductor material and the p-type region being smaller than that at the area of the transition between the intrinsic semiconductor material and the n-type surface region.

2. A semiconductor device as claimed in claim 1, characterized in that the intrinsic semiconductor region has unequal thickness layers of at least two different materials with a different band gap.

3. A semiconductor device as claimed in claim 1 or 2, characterized in that the substantially intrinsic semiconductor region is of the $\pi$-type or the $\cup$-type with a maximum impurity concentration of $5 \times 10^6$ atoms/$cm^3$.

4. A semiconductor device as claimed in claim 2, characterized in that GaAs is chosen for the semiconductor material with the smallest band gap and AlGaAs is chosen for at least one other semiconductor material.

5. A semiconductor device as claimed in claim 1 or 2, characterized in that one of an electrically insulating and an inactive layer is provided on the surface, which layer is provided with at least one aperture leaving part of the semiconductor surface free, through which aperture the electrons can be emitted from the semiconductor body.

6. A semiconductor device as claimed in claim 5, characterized in that the n-type semiconductor surface is contacted on the main surface by connection electrodes extending across said one of electrically insulating and inactive layer.

7. A semiconductor device as claimed in claim 5, characterized in that the apertures are arranged in a matrix configuration and the n-type surface regions are contacted via connection electrodes constituting column connections, while the row connections are realized via low-ohmic buried zones extending in a direction perpendicular to that of the column connections.

8. A pick-up tube provided with means for driving an electron beam, which electron beam scans a charge image, characterized in that the electron beam is generated by a semiconductor device as claimed in claims 1 or 2.

9. A display device provided with means for driving an electron beam, which electron beam produces an image, characterized in that the electron beam is generated by means of a semiconductor device as claimed in claim 1 or 2.

* * * * *